United States Patent [19]

Pashley

[11] 4,272,880
[45] Jun. 16, 1981

[54] MOS/SOS PROCESS

[75] Inventor: Richard D. Pashley, Sunnyvale, Calif.

[73] Assignee: Intel Corporation, Santa Clara, Calif.

[21] Appl. No.: 31,826

[22] Filed: Apr. 20, 1979

[51] Int. Cl.³ ............................................. H01L 21/22
[52] U.S. Cl. .................................... 29/571; 29/576 B; 29/578; 29/579; 148/1.5; 148/187; 357/42
[58] Field of Search ...................... 29/571, 576 B, 578, 29/579; 148/1.5, 187, 175; 357/42, 59

[56] References Cited

U.S. PATENT DOCUMENTS

| | | | |
|---|---|---|---|
| 3,585,088 | 6/1971 | Schwuttke et al. | 148/187 X |
| 3,639,813 | 2/1972 | Kamoshida et al. | 357/42 |
| 4,033,026 | 7/1977 | Pashley | 29/571 |
| 4,174,217 | 11/1979 | Flatley | 96/36.2 |

Primary Examiner—G. Ozaki
Attorney, Agent, or Firm—Blakely, Sokoloff, Taylor & Zafman

[57] ABSTRACT

An MOS process for fabricating multi-layer integrated circuits particularly suited for SOS fabrication is disclosed. Transistors are fabricated both on the substrate level and in an overlying polysilicon layer. Processing techniques for aligning source and drain regions with a buried gate are described. In one embodiment, a photoresist layer is exposed to light directed through the sapphire substrate, thereby employing the buried gate as a masking member. Laser annealing may be used to provide larger crystals of silicon in the polysilicon layer.

17 Claims, 16 Drawing Figures

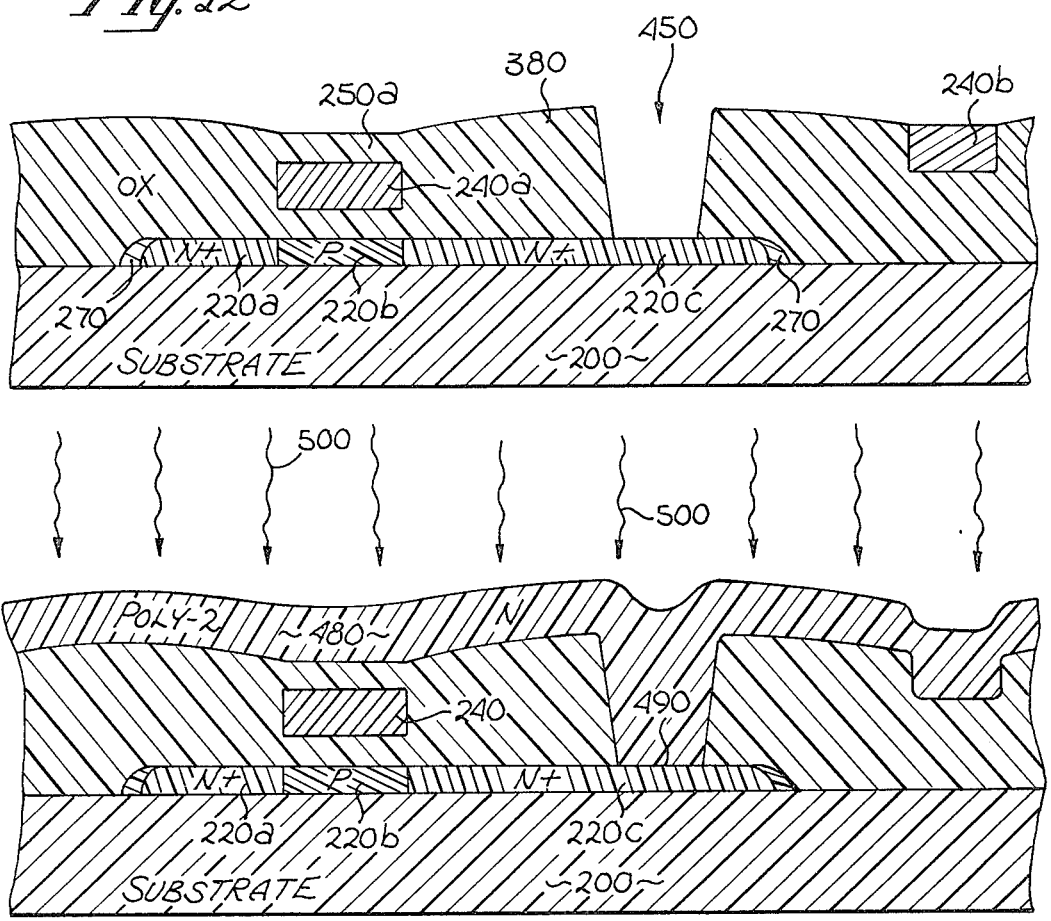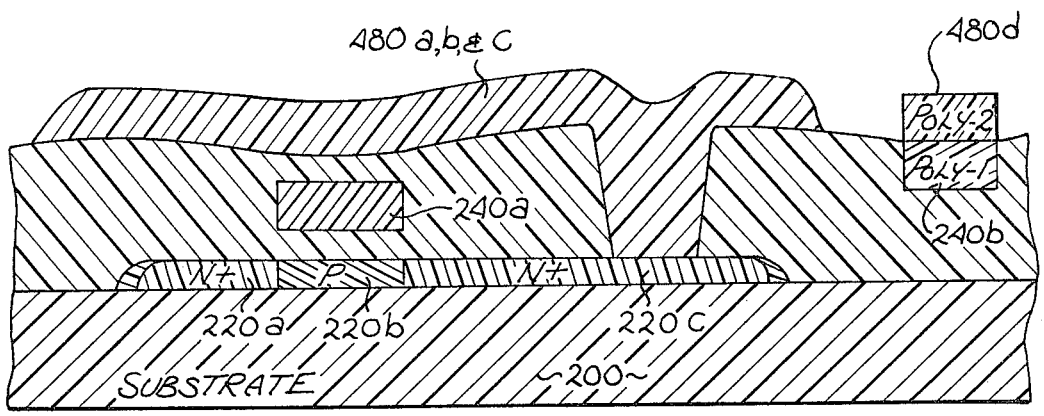

Fig. 15
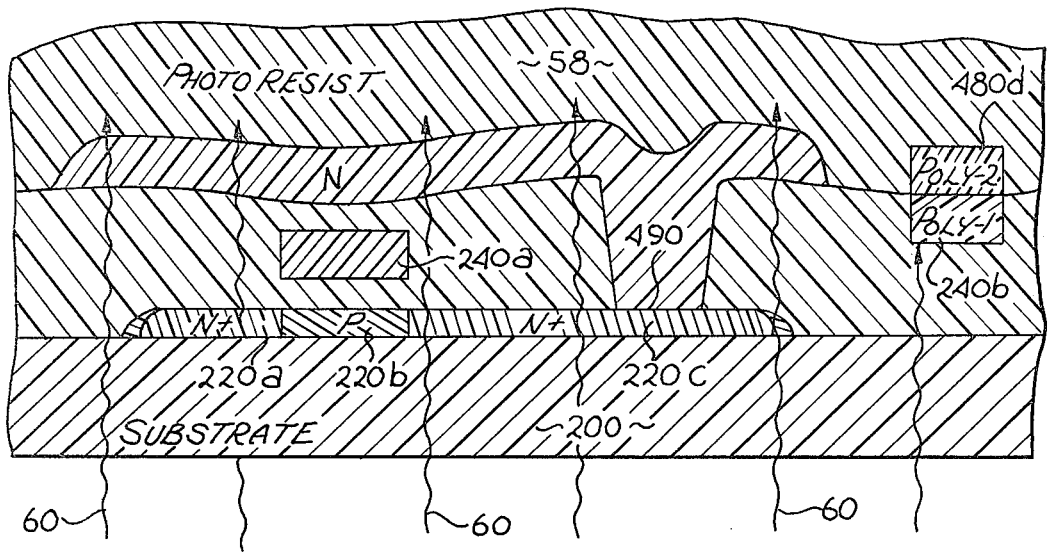
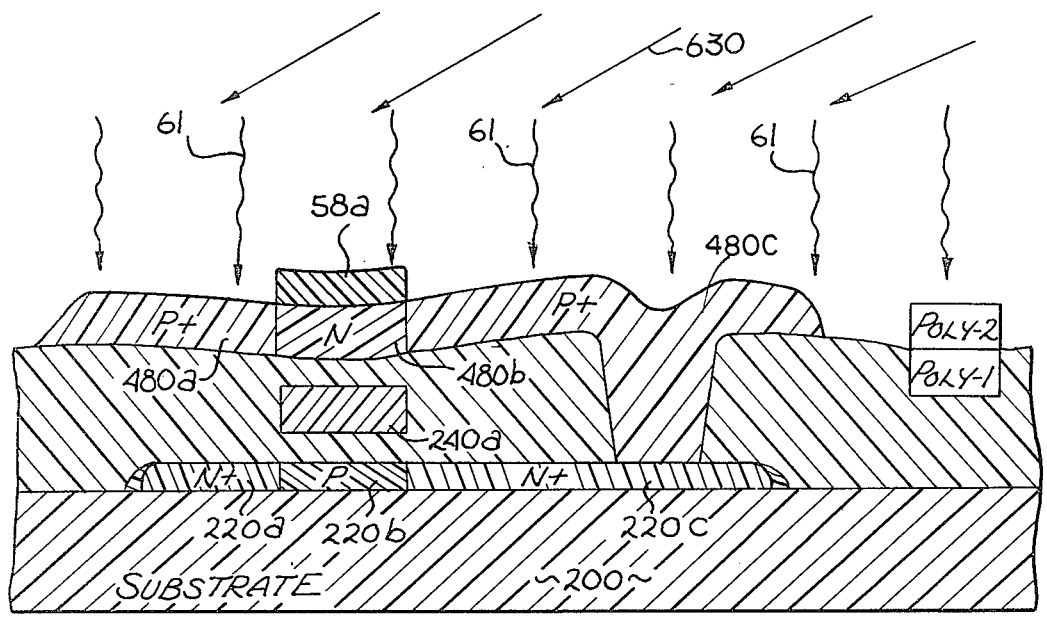
Fig. 16

MOS/SOS PROCESS

BACKGROUND OF THE INVENTION

1. Field of the Invention

The invention relates to MOS and SOS processing.

2. Prior Art

A continuing effort is occuring in the semiconductor industry to provide higher density integrated circuits. Numerous processes have been developed to provide these higher densities. Multilayer integrated circuit processing employing two and three layers of polysilicon with overlying metalization is used in some cases to increase circuit densities. V-notch MOS transistors are another example of a structure which is employed, in part, to increase circuit densities.

It has been known that some "transistor action" can be obtained in polysilicon as opposed to conventional monocrystalline silicon. Recent developments in laser annealing have shown that larger crystal grains may be formed in a polysilicon layer. In the present invention, this knowledge is used to provide transistors in a polysilicon layer.

The invented process employs unique alignment techniques, enabling multi-layer transistors to be fabricated. Alignment with buried members, such as a gate, is achieved with the present invention.

SUMMARY OF THE INVENTION

A process for fabricating two MOS transistors having a common gate region is described. A gate region is formed insulated from a substrate. This gate region has an oxide member disposed above the gate region and a silicon nitride member disposed above the oxide member. The substrate is doped in alignment with the gate region to form first source and drain regions of a first MOS transistor. An oxide layer is then formed on the substrate; the silicon nitride member prevents substantial oxide formation on the gate region during this oxide formation step. Next the oxide layer and silicon nitride member are doped and then the silicon nitride member is removed. A polysilicon layer is formed over the oxide layer and the oxide member. Dopant from the oxide layer is diffused into the polysilicon layer to form second source and drain regions of a second MOS transistor in the polysilicon layer in alignment with the common gate region. In this manner, two MOS transistors are formed in vertical alignment with one another.

BRIEF DESCRIPTION OF THE DRAWINGS

FIGS. 12 through 16 illustrate alternate processing.

FIG. 12 illustrates the substrate of FIG. 5 after the silicon nitride members have been removed and after a window is formed through the thick oxide layer for a buried contact.

FIG. 13 illustrates the substrate of FIG. 2 after a second layer of polysilicon has been formed on the substrate and during the doping of this layer.

FIG. 14 illustrates the substrate of FIG. 13 after patterns have been defined in the second layer of polysilicon.

FIG. 15 illustrates the substrate of FIG. 14 after a photoresist layer has been formed over the substrate and during the exposure of this photoresist layer to radiation directed through the substrate.

FIG. 16 illustrates the substrate of FIG. 15 after development of the photoresist layer and during the ion implantation of the second layer of polysilicon to form second source and drain regions in this layer.

DETAILED DESCRIPTION OF THE INVENTION

A metal-oxide-semiconductor (MOS) process suitable for use in silicon-on-sapphire (SOS) processing is disclosed. In the following description, numerous well-known processing steps are not set forth in detail in order not to obscure the present invention in unnecessary detail. In other instances, specific details such as specific conductivity types and dopants, layer thicknesses, etc. are set forth to provide a thorough understanding of the present invention. However, it will be obvious to one skilled in the art that these specific details need not be employed to practice the present invention.

Figure 7:
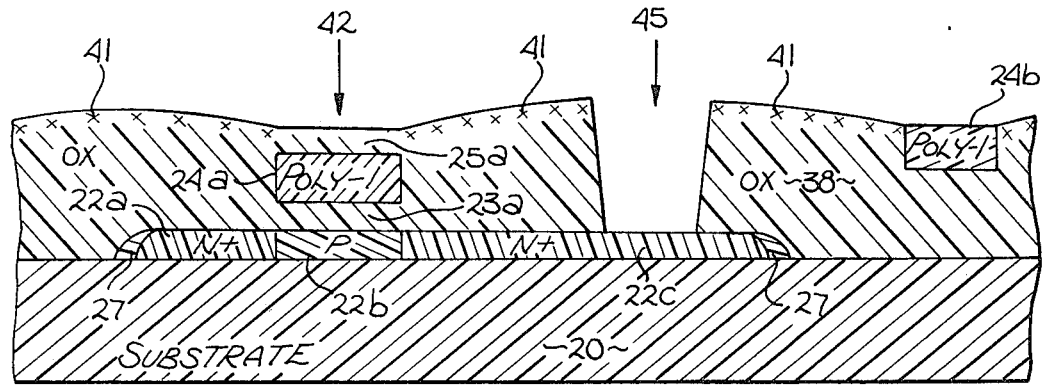
FIG. 7 illustrates the substrate of FIG. 6 after the removal of the silicon nitride masking members and after a masking and etching step used to define a window for a buried contact.
Figure 8:
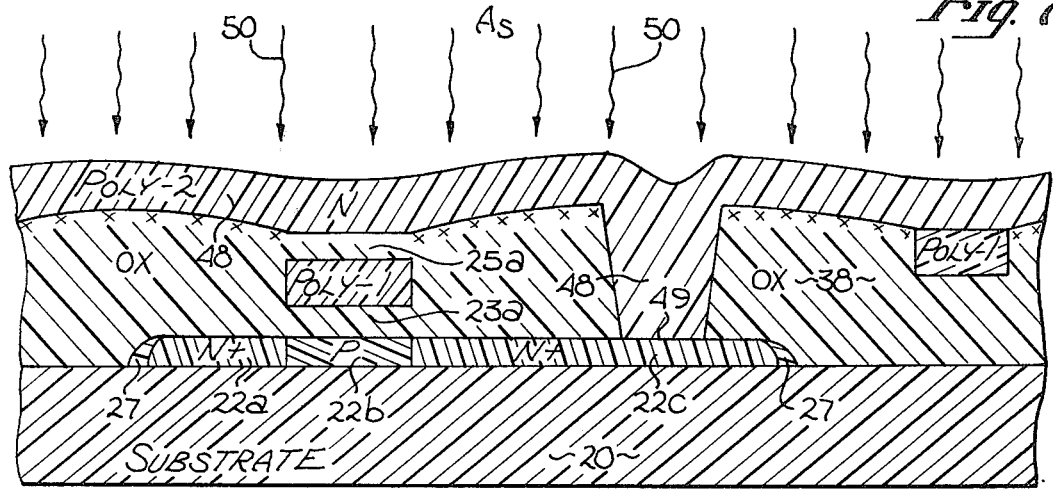
FIG. 8 illustrates the substrate of FIG. 7 after a second layer of polysilicon is formed on the substrate and during the ion implantation of this second layer of polysilicon.
Figure 9:
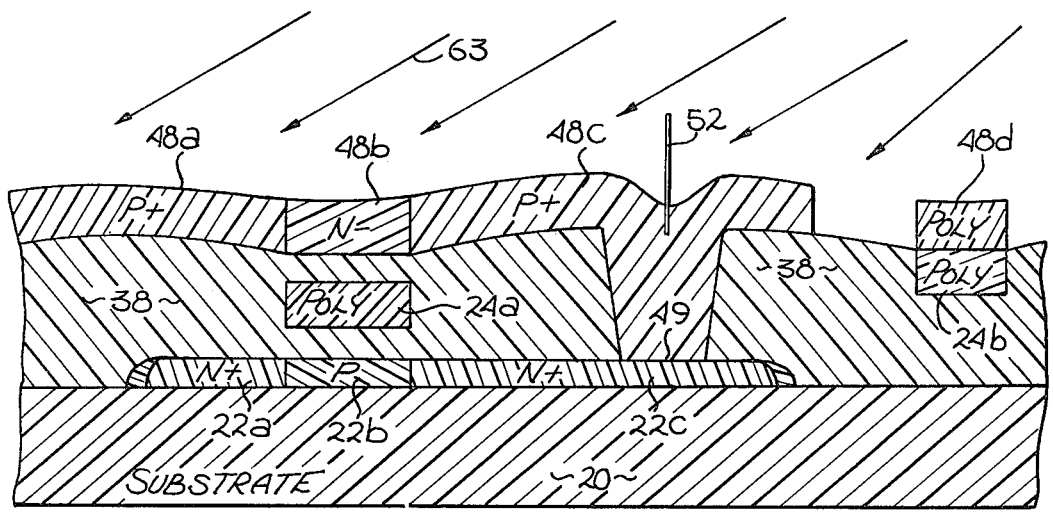
FIG. 9 illustrates the substrate of FIG. 8 after the dopant from the thick oxide layer has been diffused into the second polysilicon layer and after patterns have been defined in the second layer of polysilicon. A laser annealing step is also illustrated in this FIGURE.
Figure 11:
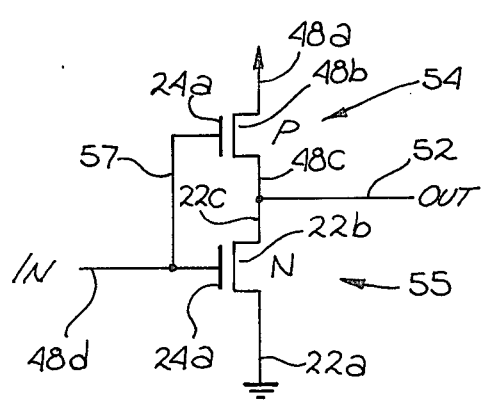
FIG. 11 is a circuit diagram of the transistor of FIG. 10.

FIGS. 1 through 9 describe various processing steps which result in the fabrication of an inverter which includes an n-channel and a p-channel field-effect transistor, commonly referred to as complementary MOS transistors (CMOS). The specific circuit fabricated with the steps shown in FIGS. 1 through 9 is illustrated in FIG. 11. In general, the n-channel transistor 55 is fabricated in a monocrystalline silicon layer or substrate. The transistors 54 and 55 have a common gate 24a which is fabricated from a first level of polysilicon. The p-channel transistor 55 is fabricated in a second level of polysilicon. A buried contact region is employed to interconnect the source region of transistor 54 and the drain region of transistor 55. An output line 52 for the inverter is shown in FIGS. 9 and 11. Simultaneously with the fabrication of the inverter of FIG. 11, a "via" contact (poly-to-poly contact) is formed to couple the gate 24a to a polysilicon line defined from the second level of polysilicon. This via contact is shown to demonstrate the flexibility of the described process.

FIGS. 12 through 16 show alternate processing where alignment is obtained by projecting light (or other radiation) through a transparent substrate such as a sapphire substrate to expose a radiation sensitive layer such as a photoresist layer.

While in the following description the processing for the CMOS inverter of FIG. 11 is described, it will be obvious to one skilled in the art that other circuit devices may be fabricated employing the process.

Figure 1:
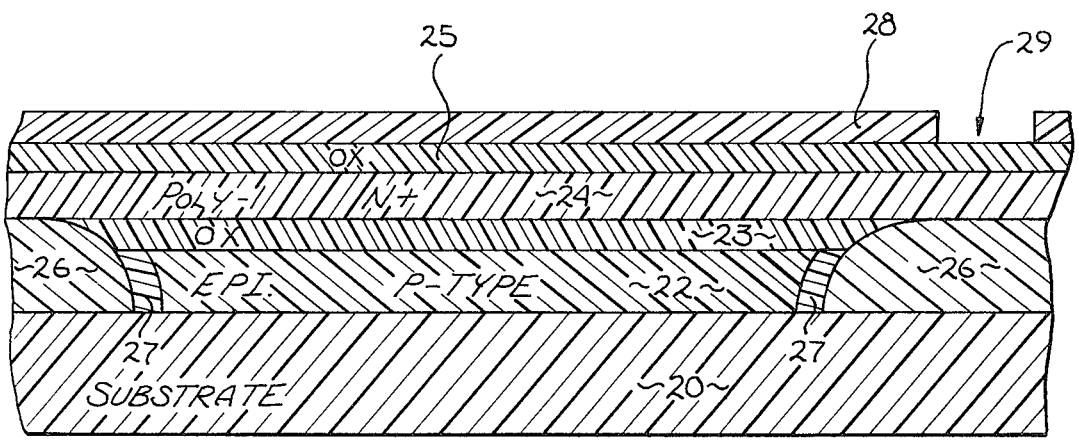
FIG. 1 is a cross-sectional elevation view of a substrate with overlying layers of silicon, oxide, polysilicon, oxide, and a masking layer.
Figure 2:
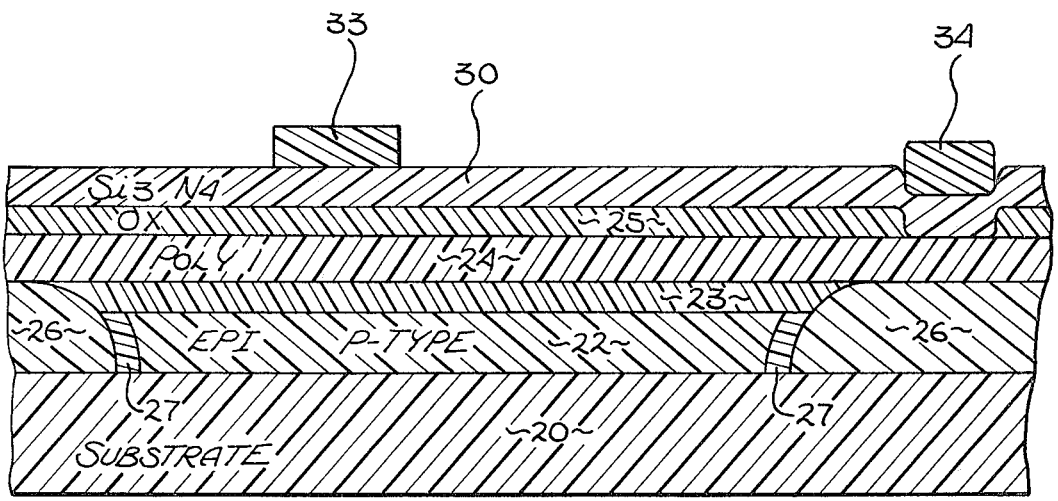
FIG. 2 illustrates the substrate of FIG. 1 after a silicon nitride layer is formed and after an additional masking step.

For the processing steps described in FIGS. 1 through 9, the transistors may be fabricated on a monocrystalline silicon substrate or on a sapphire substrate which includes an epitaxial silicon layer. In FIG. 1, a sapphire ($AL_2O_3$) crystalline substrate 20 which may be, for example, 20 mils thick, is illustrated. An epitaxial silicon layer 22 is formed on the upper surface of the substrate 20 in a well-known manner. In the presently preferred embodiment, this silicon layer is approximately 1 micron thick, since in subsequent processing an oxide layer is grown from this silicon. In the presently preferred embodiment where an n-channel transistor is fabricated in the epitaxial layer 22, this layer is doped with a p-type dopant; the layer is ion-implanted with boron to obtain a dopant concentration of $1-5 \times 10^{12}/cm^2$.

Well-known processing steps are next employed to define areas on the substrate at which active devices are fabricated. These processing steps include the formation of field oxides 26 and the channel stops 27 which are heavily doped with a p-type dopant. These channel stops reduce leakage currents as is well-known in the art. These "front-end" processing steps are described in U.S. Pat. No. 4,033,026. A first oxide layer ($SiO_2$) is also grown from the silicon layer 22. This oxide layer 23, in the presently preferred embodiment, is between 400 Å to 1,000 Å thick and is used to form a gate oxide to separate the gate from the silicon layer 22. A polycrystalline silicon (polysilicon) layer is then formed over the first oxide layer 23. The polysilicon layer 24, in the presently preferred embodiment, is approximately 5,000 Å thick and is heavily doped with an n-type dopant.

A second oxide layer 25 is formed over the polysilicon layer 24 employing chemical vapor deposition techniques or thermal oxidation in the presently preferred embodiment. This oxide layer, which is between 400 Å to 1,000 Å thick is used to form the gate oxide for the p-channel transistor. As shown in FIG. 1, a photoresist layer 28 is next formed over the oxide layer 25, then masked and etched to define a window 29. This window is formed at the site of the via (poly-to-poly) contact. The underlying oxide layer 25 is etched at the location of the window 29.

Following the removal of the photoresist layer 29 of FIG. 1, a silicon nitride ($Si_3N_4$) layer 30 is deposited over the oxide layer 25. This layer may be between 400 to 1,000 Å thick. Note that the silicon nitride layer 30 contacts the polysilicon layer 24 at the site of the via contact.

By employing ordinary masking techniques, a masking member 33 is defined on the upper surface of the silicon nitride layer 30. The member 33 is used to define the gate of the transistors of FIG. 11; in the presently preferred embodiment this member is 2-3 microns wide. Simultaneous with the fabrication of the masking member 33, a masking member 34 is defined over the silicon nitride layer 30 at the site of the via contact.

Figure 3:
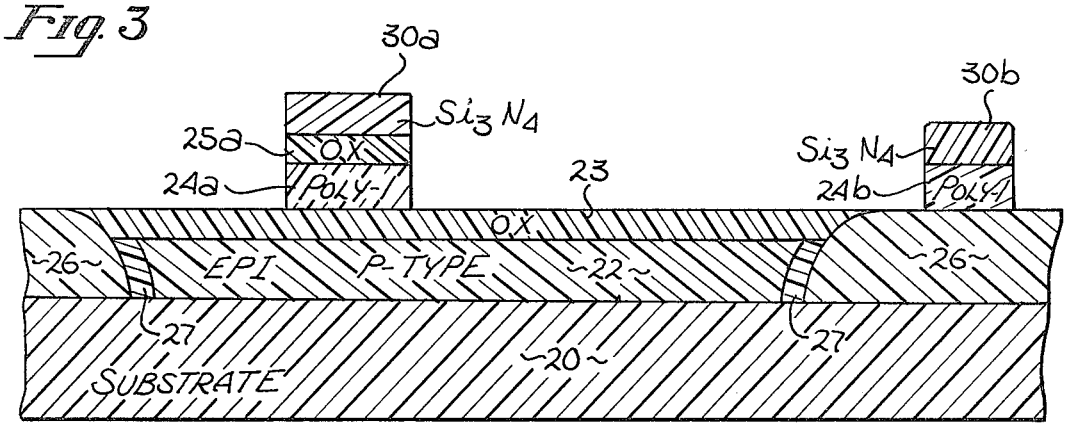
FIG. 3 illustrates the substrate of FIG. 2 after several etching steps.

Now, ordinary etching steps are employed to etch the silicon nitride layer 30, oxide layer 25 and polysilicon layer 24. After the masks 33 and 34 are removed, the resultant structure is shown in FIG. 3. A silicon nitride member 30a, formed from layer 30, is disposed above the polysilicon gate 24a which gate was formed from the polysilicon layer 24. A gate oxide member 25a formed from layer 25 is disposed between the silicon nitride member 30a and gate 24a. A silicon nitride member 30b is in direct contact with a polysilicon member 24b for the via contact. (Briefly referring to FIG. 10, the masking step defining the masking members 33 and 34 actually defines a generally U-shaped single masking member which results in the polysilicon structure shown in FIG. 10 by the "x'ed" line. One end of this polysilicon member includes the gate 24a, the other end, member 24b, interconnected by the polysilicon line 57.)

Figure 4:
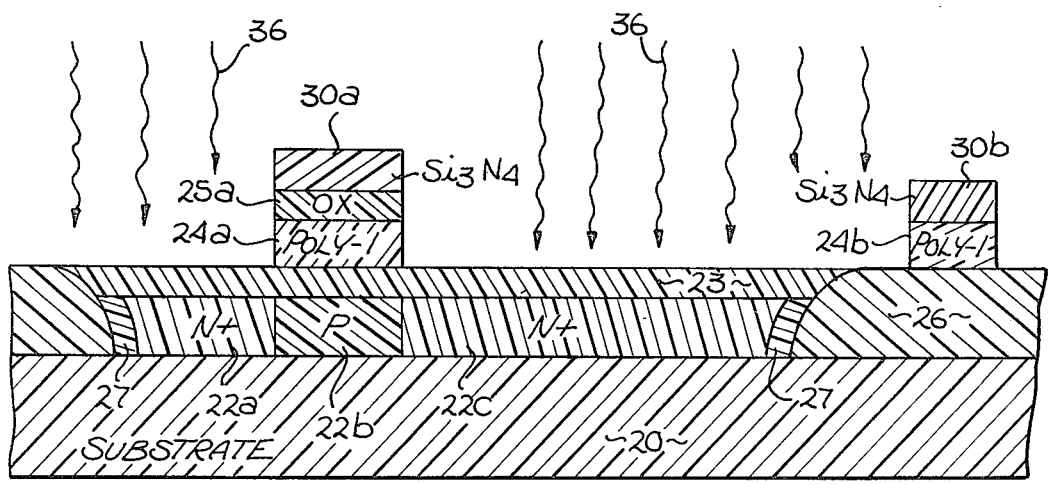
FIG. 4 illustrates the substrate of FIG. 3 during an ion implantation step used to form first source and drain regions in the silicon layer.

Next, as shown in FIG. 4 by the lines 36, the substrate is subjected to ion implantation to form the source and drain regions for the n-channel device. Specifically, regions 22a and 22c separated by the channel region 22b are formed. In the presently preferred embodiment, this ion implantation occurs through the oxide layer 23 in alignment with gate 24a. An arsenic dopant is presently preferred, doping the source and drain regions to a level of approximately $4 \times 10^{15}/cm^2$. (Referring briefly to FIG. 10, in the plan view this ion implantation step forms the T-shaped doped region shown by the solid line ad labeled "EPI doping", with no doping beneath gate 24a.)

Figure 5:
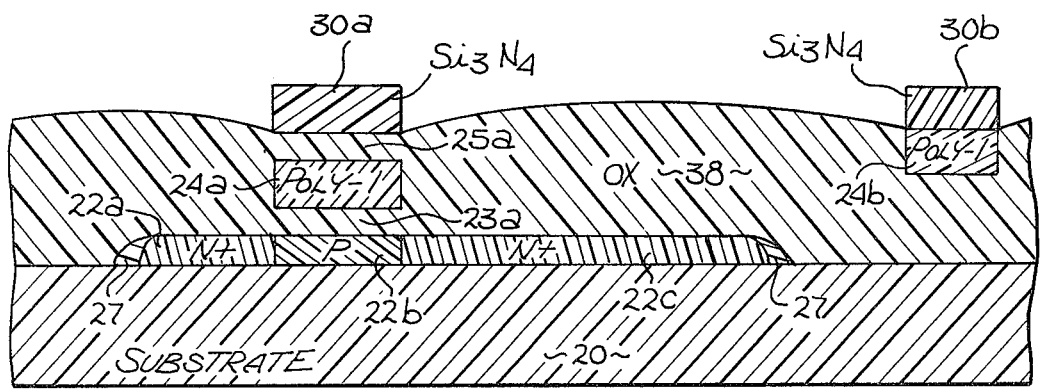
FIG. 5 illustrates the substrate of FIG. 4 after a thick oxide layer is grown on the substrate.

Now a thick oxide layer 38 is grown from the epitaxial layer 22. This layer may be 4,000±2,000 Å thick. As best shown in FIG. 5, the silicon nitride members 30a and 30b prevent the growth of this oxide on the polysilicon in contact with them. Thus, the thickness of the oxide between the member 30a and the gate 24a, shown as the second gate oxide 25a, remains substantially constant; similarly, no oxide develops on the upper surface of the polysilicon member 24b. It should be noted that since the oxide beneath the gate 24a is covered by the gate, this oxide does not significantly thicken.

Figure 6:
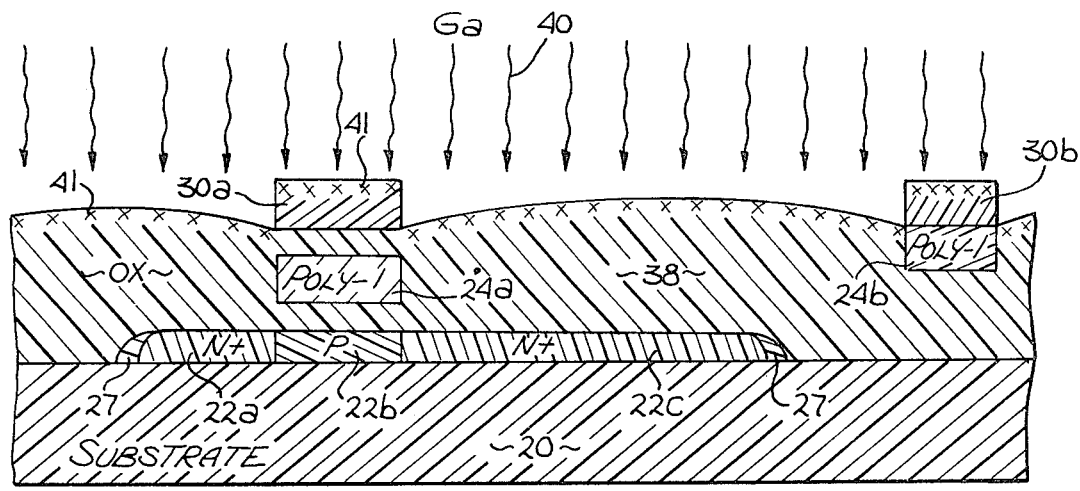
FIG. 6 illustrates the substrate of FIG. 5 during an ion implantation step used to implant the upper surface of the thick oxide layer.

Next, as shown in FIG. 6 by lines 40, the substrate is again subjected to ion implantation with a p-type dopant. For this particular processing step, a readily diffusable dopant is employed. In the presently preferred embodiment, gallium is implanted at an energy level of approximately 20 Kev to provide a dopant concentration of approximately $1 \times 10^{15}/cm^2$. The dopant, at this point in the processing, does not diffuse deeply into the oxide layer 38 and is shown at the surface of oxide layer 38 and along the upper surfaces of the silicon nitride member 30a and 30b by the "x's" 41.

As shown in FIG. 7, the silicon nitride members 30a and 30b are removed employing readily known etchants. An ordinary masking and etching step is employed to define the window 45 which extends through the oxide layer 28 exposing the underlying region 22c. This window is formed for a buried contact.

A second layer of polysilicon, shown as layer 48 in FIG. 8, is now formed over the oxide layer 38. This layer is approximately 5,000 Å thick, in the presently preferred embodiment. Note this polysilicon layer forms a contact 48 which contacts the region 22c at the surface 49. As shown in FIG. 8 by lines 50, this layer of polysilicon is then subjected to ion implantation to dope the polysilicon with an n-type dopant. In the presently preferred embodiment, arsenic or phosphorus is employed to dope the layer 48 to a dopant concentration level of approximately $1 \times 10^{15}/cm^2$.

Figure 10:
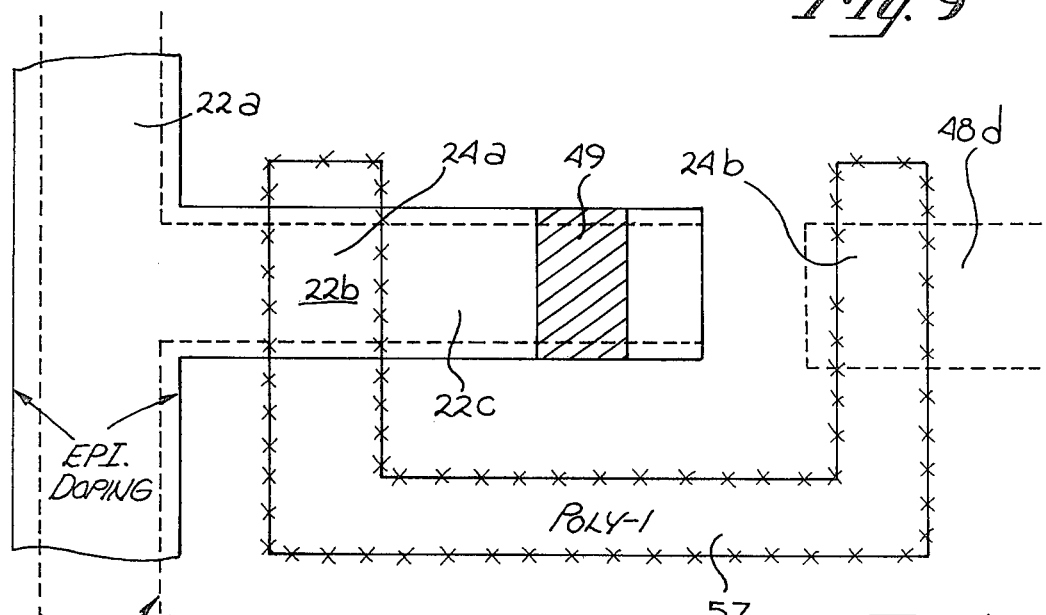
FIG. 10 is a plan view of the transistor fabricated with the steps of FIGS. 1 through 9.

Now an ordinary masking and etching step is employed to define members from the second layer of polysilicon. Referring briefly to FIG. 10, this masking and etching step defines the members shown by the broken line, specifically the T-shaped structure and a line 48d. Note that the line 48d is in direct contact with the first layer polysilicon member 24b, thus providing a via contact.

Next the substrate is subjected to a carefully controlled driver step. In the presently preferred embodiment, the substrate is heated to a temperature of approximately 1,000° C. to cause the gallium residing in the upper surface of the oxide layer 38 to diffuse. The time and temperature is controlled to cause the gallium to diffuse into the overlying second level polysilicon layer 48. However, this driver step does not continue sufficiently long to cause the gallium dopant to affect the doping levels in the epitaxial layer 22. This diffusion of the gallium forms the p+ region 48a and the p+ region 48c. Note that since the silicon nitride member 30a was removed (see FIGS. 6 and 7), there is no gallium dopant above the gate 24a to change the conductivity type of the n-type region 48b.

Thus, by doping the upper surface of the oxide layer 38 and by subsequently removing the silicon nitride member, the regions 48a and 48c are formed in alignment with the underlying buried gate 24a.

To enhance the characteristics of the transistor or transistors fabricated in the second layer of polysilicon, the polysilicon may be laser annealed. This annealing produces larger crystalline grains, thereby providing more of the characteristics associated with transistors fabricated in a monocrystalline silicon layer. This laser annealing is shown in FIG. 9 by the lines 63. For a discussion of this technique, see "CW Laser Anneal of Polycrystalline Silicon: Crystalline Structure, Electrical Properties" by Gerzberg, Gibbons, Magee, Penz and Hong, *Applied Physics Letters*, Volume 33, No. 8, Oct. 15, 1978.

In the presently preferred embodiment, as shown in the FIGURES, a gate oxide is formed from the second oxide layer 25 which separates the gate 24a from the silicon nitride member 30a, for example, see FIG. 4. For some processes it may be desirable to eliminate the oxide layer 25, thus forming the silicon nitride member 30a directly on the polysilicon gate 24a. For these processes, the step shown in FIG. 6 of implanting the gallium proceeds in the same manner as described above. However, instead of removing the entire silicon nitride member 30a as shown in FIG. 7, only a portion of the member 30a is removed by etching. For example, if the silicon nitride member 30a is 1,000 Å thick, 500 Å of this member may be etched away, leaving silicon nitride insulation between the gate 24a and the second layer polysilicon. Note that in removing at least a portion of the silicon nitride member 30a, the gallium dopant is removed, thus providing the alignment of the source and drain regions 48c and 48a of FIG. 9 with the underlying buried gate 24a.

It is apparent from FIGS. 9 and 10 that the inverter requires much less substrate area than prior art inverters. Thus, the described process is useful for providing high density integrated circuits. Moreover, because both pairs of source and drain regions are in alignment with the common gate, good performance is obtained.

In the alternate processing shown in FIGS. 12 through 16, like steps and like structure to that shown in FIGS. 1 through 9 are shown with the same numerals, however with the addition of a "0" to the numerals. The processing for this alternate embodiment is the same as described above in conjunction with FIGS. 1 through 5. The gallium implant shown in FIG. 6 is not employed; rather, the silicon nitride members 30a and 30b of FIG. 5 are removed.

Referring now to FIG. 12, a window 450 is formed in the oxide layer 380 for the buried contact.

Next, as shown in FIG. 13, a second layer of polysilicon 480 is formed over the substrate. This layer may have the same thickness as layer 48. Then, ion implantation of an n-type dopant such as arsenic is employed to lightly dope the layer 480. A concentration level of $1-5 \times 10^{12}/cm^2$ is employed in the presently preferred embodiment.

Now, as shown in FIG. 14, with an ordinary masking and etching step, the desired members in the second layer of polysilicon are defined. These members correspond to the second layer polysilicon patterns shown, for example, in FIG. 10.

In FIG. 15, the substrate is shown after a photoresist layer 58 is formed over the substrate and over the second layer of polysilicon. To define these regions, the photoresist layer 58 is exposed to light or other radiation by projecting the light 60 through the underside of the substrate 200. For this reason, the substrate 200 must be relatively transparent or translucent, as is the case with a sapphire substrate. The intensity of this light is selected such that the photoresist is exposed except above the gate 240a. That is, the additional silicon present in the gate 240a prevents the light from reaching the photoresist directly above the gate 240a. (Note that while it appears in FIG. 15 that there is additional polysilicon from the layer 480 which extends into the well and contacts the area 490, this additional silicon is not actually present in practice. In practice, the layer 480 has a relative uniform thickness even at the regions of the buried contacts. While this uniform thickness would appear in a drawing done to scale, a scaled drawing has not been used since it is not practical for explaining the invention.)

As shown in FIG. 16, after the photoresist layer is developed, a masking member 58a is formed in alignment with the underlying buried gate 240a. Now the substrate is subjected to ion implantation 61 to dope regions 480a and 480c and define regions 480b. These regions are formed in alignment with the masking member 58a, and hence, are in alignment with the underlying gate 240a. A boron dopant is employed to form the heavily doped p-type regions 480a and 480c.

The entire substrate may now be subjected to laser annealing as shown by lines 630, to provide larger crystalline grains in the polysilicon layer. The resultant structure is identical to the structure of FIGS. 9 and 10.

It will be apparent to one skilled in the art that some of the above-described steps may be performed in different orders with the same result. For example, the laser annealing may be performed prior to the masking and etching step used to define patterns in the second layer of polysilicon. Also in some cases, rather than employing ion implantation to dope regions, other well-known doping techniques may be employed. It will also be obvious to one skilled in the art that both the transistors 54 and 55 of FIG. 11 may be of the same conductivity type, that is, both n-channel or p-channel devices.

Numerous other integrated circuit structures other than the described inverter may be fabricated with the disclosed process by employing the described buried contact and via contact and with overlying metal layers.

Thus, an MOS process has been disclosed which is particularly useful for SOS structures. The process permits the alignment between a buried member such as a gate and overlying members or regions such as source and drain regions.

I claim:

1. A process for fabricating two MOS transistors having a common gate region on a substrate comprising the steps of:

forming a gate region insulated from said substrate, said gate region having an oxide member disposed above said gate region and a silicon nitride member disposed above said oxide member;

doping said substrate in alignment with said gate region to form first source and drain regions of a first MOS transistor;

forming an oxide layer on said substrate, said silicon nitride member preventing substantial oxide formation on said gate region during the oxide formation step;

doping said oxide layer and silicon nitride member;

removing said silicon nitride member;

forming a polysilicon layer over said oxide layer and said oxide member; and diffusing the dopant from said oxide layer into said polysilicon layer so as to form second source and drain regions of a second MOS transistor in said polysilicon layer in alignment with said common gate region, whereby two MOS transistors are formed in vertical alignment with one another.

2. The process defined by claim 1 wherein said gate region is formed in alignment with said silicon nitride and oxide members.

3. The process defined by claim 2 wherein said polysilicon layer is a doped layer of the opposite conductivity type to said substrate.

4. The process defined by claim 3 wherein said polysilicon layer is laser-annealed so as to form larger silicon crystals.

5. The process defined by claim 3 wherein said doping of said oxide layer comprises doping the upper surface of said oxide layer with gallium.

6. The process defined by claim 1 wherein said substrate comprises an epitaxial layer of silicon formed on sapphire.

7. A process for forming a second MOS transistor above a first MOS transistor, said first transistor being disposed on a silicon surface and including a gate region and a silicon nitride member disposed above said gate, comprising the steps of:

growing an oxide layer on said silicon surface such that said silicon nitride member prevents any substantial oxide growth between said gate and said silicon nitride member;

doping the upper surface of said oxide layer and said silicon nitride member;

removing at least the doped portion of said silicon nitride member;

forming a polysilicon layer over said substrate; and diffusing said dopant from said oxide layer into said polysilicon layer so as to form source and drain regions in said polysilicon layer in alignment with said gate, whereby a second MOS transistor is formed above said first MOS transistor.

8. The process defined by claim 7 wherein a gate oxide member is disposed between the upper surface of said gate region and said silicon nitride member and wherein said step of removing at least said doped portion of said silicon nitride member comprises the removal of the entire said silicon nitride member.

9. The process defined by claims 7 or 8 wherein said polysilicon layer is a doped layer doped with an opposite conductivity type dopant that the channel region of said first transistor.

10. The process defined by claims 7 or 8 including the step of laser annealing said polysilicon layer so as to form larger silicon crystals.

11. The process defined by claims 7 or 8 wherein said silicon surface is the surface of an epitaxial silicon layer disposed on a sapphire substrate.

12. The process defined by claims 7 or 8 wherein said doping of said upper surface of said oxide layer comprises the step of doping said upper surface with gallium.

13. A process for forming a second MOS transistor above a first MOS transistor, said first transistor being disposed on an epitaxial silicon layer formed on a transparent substrate, said first transistor including a gate region and a silicon nitride member disposed above said gate region, comprising the steps of:

growing an oxide layer on said silicon layer such that said silicon nitride member prevents any substantial oxide growth between said gate region and said silicon nitride member;

forming a polysilicon layer over said substrate above said oxide layer;

forming a radiation sensitive layer on said polysilicon layer;

exposing said radiation sensitive layer to radiation directed through said transparent substrate such that said radiation sensitive layer disposed above said gate region remains substantially unaffected by said radiation;

removing said radiation sensitive layer so as to define a mask in alignment with said gate region; and doping said polysilicon layer to form source and drain regions in alignment with said gate region, whereby a second transistor is formed above said first transistor.

14. The process defined by claim 13 wherein an oxide member is disposed between said gate region and said silicon nitride member and wherein said silicon nitride member is removed prior to said formation of said polysilicon layer.

15. The process defined by claim 14 wherein said substrate comprises sapphire.

16. A process for forming a pair of complementary MOS transistors on a silicon surface comprising the steps of:

forming a first gate oxide layer on said silicon surface;

forming a first layer of polysilicon on said first oxide layer;

forming a second gate oxide layer on said first polysilicon layer;

defining a silicon nitride masking member on said second oxide layer;

etching said second oxide layer and said first polysilicon layer to define a gate member and a second gate oxide member;

forming first source and drain regions in said silicon surface with a first conductivity type dopant in alignment with said gate member;

growing a third oxide layer over said silicon surface such that said silicon nitride member prevents any substantial growth of said second gate oxide;

doping the upper surface of said third oxide layer and said silicon nitride member with a second conductivity type dopant;

removing said silicon nitride member;

forming a second layer of polysilicon over said third oxide layer;

diffusing the dopant from said third oxide layer into said second polysilicon layer so as to form second source and drain regions in alignment with said gate, whereby a pair of complementary transistors are formed having source and drain regions in alignment with said gate.

17. The process defined by claim 16 wherein said silicon surface comprises an epitaxial silicon layer disposed on a sapphire substrate.

* * * * *

UNITED STATES PATENT AND TRADEMARK OFFICE
CERTIFICATE OF CORRECTION

PATENT NO. : 4,272,880
DATED : June 16, 1981
INVENTOR(S) : Richard D. Pashley

It is certified that error appears in the above-identified patent and that said Letters Patent is hereby corrected as shown below:

Column 2, line 21, after "FIG." "2", second occurrence, should read -- 12 --.

Column 3, line 35, after "U.S." insert -- Letters --.

Signed and Sealed this

Twentieth Day of December 1983

[SEAL]

Attest:

GERALD J. MOSSINGHOFF

Attesting Officer  Commissioner of Patents and Trademarks